(12) United States Patent
Kim

(10) Patent No.: US 6,955,748 B2
(45) Date of Patent: Oct. 18, 2005

(54) PVD TARGET CONSTRUCTIONS COMPRISING PROJECTIONS

(75) Inventor: Jaeyeon Kim, Liberty Lake, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/614,806

(22) Filed: Jul. 9, 2003

(65) Prior Publication Data

US 2004/0089543 A1 May 13, 2004

Related U.S. Application Data

(60) Provisional application No. 60/396,543, filed on Jul. 16, 2002.

(51) Int. Cl.[7] .............................................. C23C 14/34
(52) U.S. Cl. ................................................. 204/298.12
(58) Field of Search .................................... 204/298.12

(56) References Cited

U.S. PATENT DOCUMENTS

| | | | | |
|---|---|---|---|---|
| 5,269,403 A | * | 12/1993 | Pouliquen et al. | 204/298.12 |
| 5,474,649 A | | 12/1995 | Kava et al. | 156/643.1 |
| 5,942,041 A | | 8/1999 | Lo et al. | 118/728 |
| 6,277,194 B1 | | 8/2001 | Thilderkvist et al. | 117/94 |
| 6,503,380 B1 | * | 1/2003 | Buehler | 204/298.12 |
| 2002/0079217 A1 | * | 6/2002 | Buehler | 204/298.12 |

FOREIGN PATENT DOCUMENTS

JP            2001-316798           11/2001     ............ C23C/14/00

OTHER PUBLICATIONS

PCT Search report US03/22107.
PCT Search report. US04/14800.

* cited by examiner

Primary Examiner—Steven Versteeg
(74) Attorney, Agent, or Firm—Wells St. John P.S.

(57) ABSTRACT

The invention includes PVD targets having non-sputtered regions (such as, for example, sidewalls), and particle-trapping features formed along the non-sputtered regions. In particular aspects, the particle-trapping features can comprise a pattern of bent projections forming receptacles, and can comprise microstructures on the bent projections. The targets can be part of target/backing plate constructions, or can be monolithic. The invention also includes methods of forming particle-trapping features along sidewalls of a sputtering target or along sidewalls of a target/backing plate construction. The features can be formed by initially forming a pattern of projections along a sidewall. The projections can be bent and subsequently exposed to particles to form microstructures on the bent projections.

19 Claims, 5 Drawing Sheets

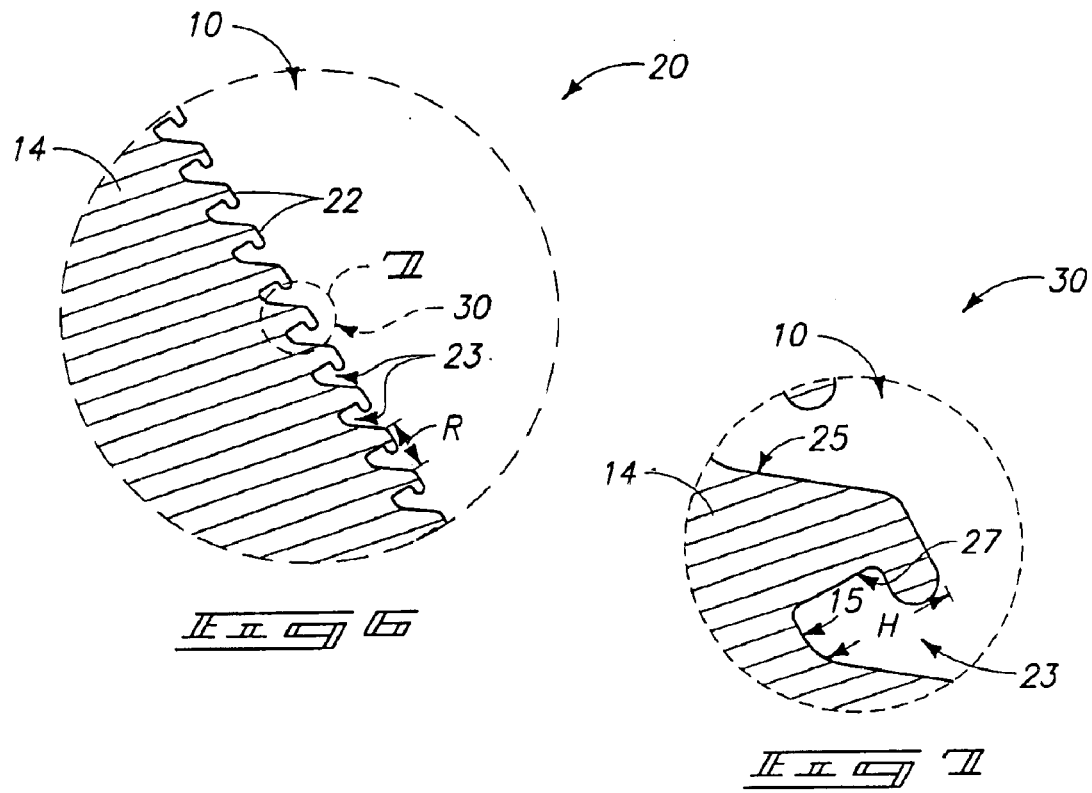
FIG. 6
FIG. 7
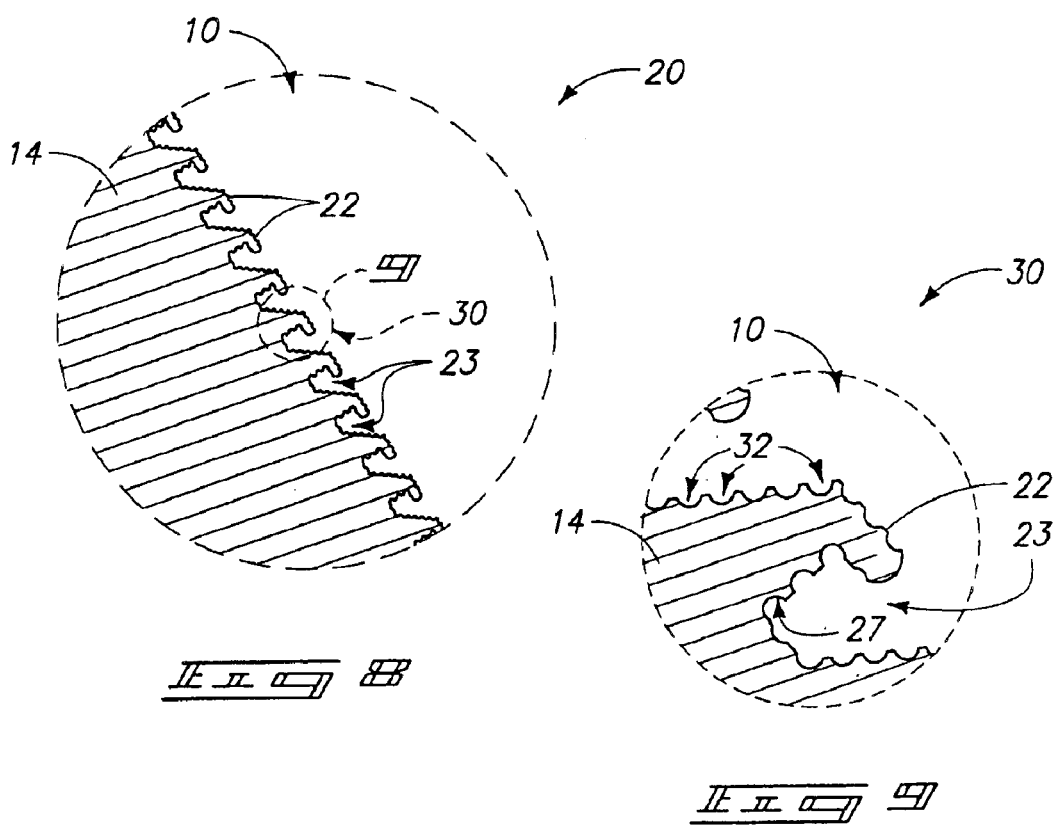
FIG. 8
FIG. 9

US 6,955,748 B2

PVD TARGET CONSTRUCTIONS COMPRISING PROJECTIONS

RELATED PATENT DATA

This patent claims priority to U.S. Provisional Patent Application 60/396,543, which was filed Jul. 16, 2002.

TECHNICAL FIELD

The invention pertains to methods of forming particle traps along non-sputtered regions of a physical vapor deposition (PVD) target construction, and pertains to PVD target constructions having projections along at least one non-sputtered region.

BACKGROUND OF THE INVENTION

Deposition methods are utilized for forming films of material across substrate surfaces. Deposition methods can be utilized in, for example, semiconductor fabrication processes to form layers ultimately utilized in fabrication of integrated circuitry structures and devices. An exemplary deposition method is physical vapor deposition (PVD), which includes sputtering processes.

A physical vapor deposition operation is described with reference to a sputtering apparatus 110 in FIG. 1. Apparatus 110 is an example of an ion metal plasma (IMP) apparatus, and comprises a chamber 112 having sidewalls 114. Chamber 112 is typically a high vacuum chamber. A target 10 is provided in an upper region of the chamber, and a substrate 118 is provided in a lower region of the chamber. Substrate 118 is retained on a holder 120, which typically comprises an electrostatic chuck. Target 10 would be retained with suitable supporting members (not shown), which can include a power source. An upper shield (not shown) can be provided to shield edges of the target 10.

Substrate 118 can comprise, for example, a semiconductor wafer, such as, for example, a single crystal silicon wafer. A metal-containing film can be over a surface of the substrate in particular applications. Target 10 can comprise, for example, one or more of nickel, tantalum, titanium, copper, aluminum, silver, gold, niobium, platinum, palladium, tungsten and ruthenium, including one or more alloys of the various metals. Exemplary targets can comprise one or more of various mixtures, compounds or alloys including, for example, Ti/N, Ti/Nb, Ti/W and Ti/Al. The target can be a monolithic target, or can be part of a target/backing plate assembly.

Material is sputtered from a surface of target 10 and directed toward substrate 118. The sputtered material is represented by arrows 122.

Generally, the sputtered material will leave the target surface in a number of different directions. This can be problematic, and it is preferred that the sputtered material be directed relatively orthogonally to an upper surface of substrate 118. Accordingly, a focusing coil 126 is provided within chamber 112. The focusing coil can improve the orientation of sputtered materials 122, and is shown directing the sputtering materials relatively orthogonally to the upper surface of substrate 118.

Coil 126 is retained within chamber 112 by pins 128 which are shown extending through sidewalls of the coil and also through sidewalls 114 of chamber 112. Pins 128 are retained within retaining screws 132 in the shown configuration. The schematic illustration of FIG. 1 shows heads 130 of the pins along the exterior surface of chamber sidewalls 114, and another set of heads of the retaining screws 132 along an interior surface of coil 126.

Spacers 140 extend around pins 128, and are utilized to space coil 126 from sidewalls 114.

Problems can occur in deposition processes if particles are formed, in that the particles can fall into a deposited film and disrupt desired properties of the film. Accordingly, it is desired to develop traps which can alleviate problems associated with particles falling into a desired material during deposition processes.

Some efforts have been made to modify PVD targets to alleviate particle formation. For instance, bead blasting has been utilized to form a textured surface along sidewalls of a target with the expectation that the textured surface will trap particles formed along the surface. Also, knurling and machine scrolling have been utilized to form textures on target surfaces in an effort to create appropriate textures that will trap particles.

Although some of the textured surfaces have been found to reduce particle formation, the particle formation is frequently not reduced to a desired level. In some instances, the texturing on a sidewall surface of a target can ultimately lead to formation of very large particles. Specifically, films of sputtered material form on the textured surface over time, and at some point the films peel away from the target. The films can fall onto a substrate during a PVD process to cause a defect in a layer deposited during the PVD process. This problem is frequently encountered with textures which have been formed through machine scrolling and/or knurling.

Another problem is that the formation of a textured surface can itself introduce contaminants. For instance, bead-blasting typically utilizes particles blasted at the target with high energy to texture a surface of the target. Some of the particles from for the blasting can be imbedded in the target during the blasting process, remain with the target as it is inserted in a PVD chamber, and then fall from the target during a sputtering process to become problematic contaminants during the sputtering.

It would be desired to develop a new texture which can be formed on sidewalls or other non-sputtered surfaces of a PVD target construction to better alleviate particle formation than prior art textures, and it would be particularly desirable if the new texture could eliminate undesired peeling of materials from sidewalls and other non-sputtered surfaces of a target construction during PVD processing. It would also be desired to reduce, and preferably eliminate sputtering process contamination resulting from embedded bead-blasted particles in sputtering target constructions.

SUMMARY OF THE INVENTION

In one aspect, the invention includes a method of treating a non-sputtered surface (such as, for example, a sidewall, flange, or non-sputtered region of a sputtering face) of a PVD target construction. A pattern of projections is formed along the non-sputtered surface. The projections are bent. The projections are also exposed to particles to form microstructures on the projections. The projections can be exposed to the particles either before or after the bending of the projections.

In one aspect, the invention includes a PVD target construction having a sidewall proximate a sputtering face. The sidewall forms a lateral periphery of the target construction. The target construction includes a pattern of curved projections along the sidewall. The projections form cavities which open laterally along the sidewall.

In one aspect, the invention includes a PVD target construction having a sidewall proximate a sputtering face, and comprising a repeating pattern of receptacles along the sidewall. The receptacles have inner surfaces, and the target construction further comprises microstructures on the inner surfaces of the receptacles.

BRIEF DESCRIPTION OF THE DRAWINGS

Preferred embodiments of the invention are described below with reference to the following accompanying drawings.

FIG. 6 is a view of the FIG. 4 expanded region shown at a processing stage subsequent to that of FIG. 5.

FIG. 7 is a view of an expanded region of the FIG. 6 structure (the region labeled 7 in FIG. 6).

FIG. 8 is a view of the FIG. 4 expanded region shown at a processing stage subsequent to that of FIG. 6.

FIG. 9 is a view of an expanded region of the FIG. 8 structure (the region labeled 9 in FIG. 8).

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses new textures which can be formed on one or more surfaces of a PVD target or target/backing plate assembly, and utilized for trapping sputtered materials which redeposit on the target or assembly. In a particular aspect, curved projections (such as, for example, a bent scroll pattern) are formed on non-sputtered surfaces of a target or target/backing plate assembly to form particle trapping areas. The non-sputtered surfaces can include sidewall surfaces, flange surfaces and/or non-sputtered surfaces along a sputtering face. The projections can be exposed to particles to roughen surfaces of the projections. The projections can be considered to form a macro-scale roughness of a trapping area, and the roughened surfaces of the projections can be considered to form a micro-scale roughness of the trapping area. Thus, the invention can include patterns which have both macro-scale and micro-scale roughness, and which are utilized in trapping areas.

The utilization of both macro-scale and micro-scale patterns can be advantageous. The macro-scale pattern and micro-scale pattern can significantly reduce material fall off from a target and/or backing plate surface. Also, the formation of a micro-scale rough surface on the macro-scale pattern can effectively reduce problems that may otherwise be associated with cyclic thermal stresses occurring during cyclic sputtering processes. Specifically, a macro-scale pattern alone (such as, for example, a long machined scroll) can trap re-deposited materials to form a long film within a trapping region. Thermal stresses (such as stress associated with, for example, a different thermal expansion coefficient of the redeposited film versus the base material of the target and/or backing plate), can lead to peeling of the film from the target and/or backing plate. As the film peels from the target and/or backing plate, it can fall onto a substrate underlying the target to undesirably form particles within a layer sputter-deposited on the substrate during a PVD process. Additionally or alternatively, the peeling film can fall directly onto an electrostatic chuck provided to support the substrate, which can create system failure. In particular aspects the invention encompasses bead-blasting and/or steel brushing and/or other treatment of a macro-scale pattern to form microstructures on the pattern which can ultimately be utilized to assist in retaining redeposited materials within the pattern, and can thus alleviate, or even prevent, peeling of redeposited film materials from the trapping area.

Figure 2:
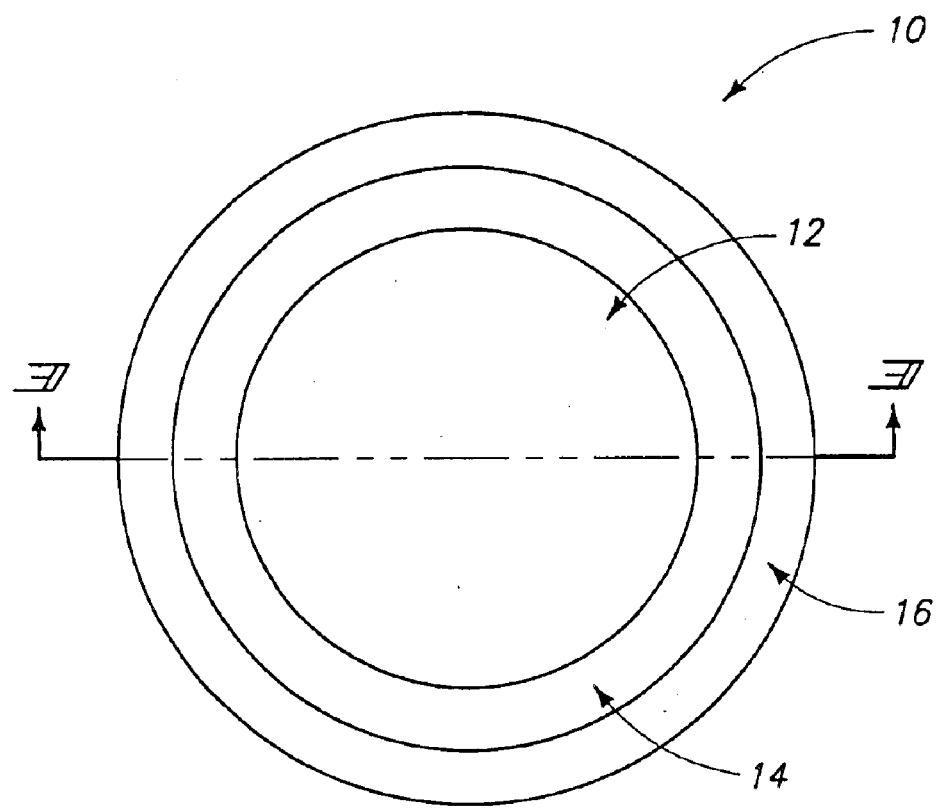
FIG. 2 is a diagrammatic, top view of an exemplary target construction suitable for utilization in methodology of the present invention.
Figure 3:
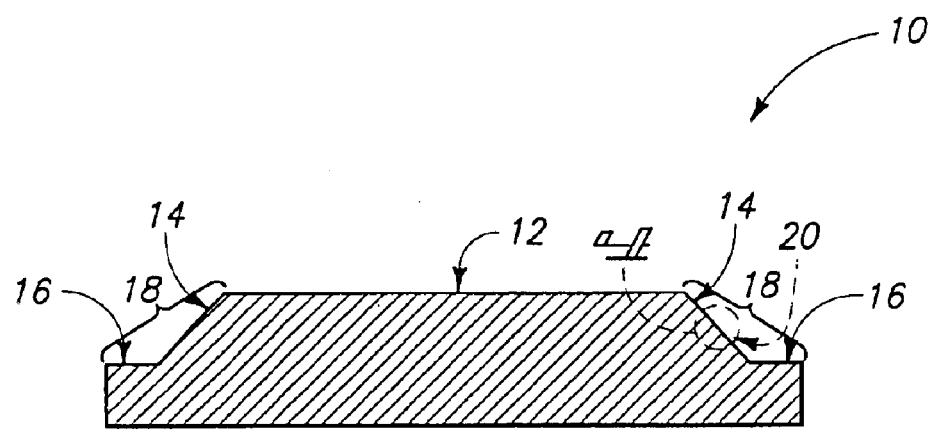
FIG. 3 is a diagrammatic, cross-sectional view along the line 3—3 of FIG. 2.

Particular aspects of the invention are described with reference to FIGS. 2–11. Referring initially to FIGS. 2 and 3, an exemplary sputtering target construction 10 is illustrated in top view (FIG. 2) and cross-sectional side view (FIG. 3). Construction 10 can be a monolithic physical vapor deposition target. Target construction 10 comprises a sputtering face 12 and sidewalls 14 proximate the sputtering face. Construction 10 also comprises a flange 16 extending around a lower region of the target construction. Construction 10 is shown as a VECTRA-IMP™-type target, such as is available from Honeywell International Inc., but it is to be understood that other target constructions can be utilized in various aspects of the present invention.

Sputtering face 12 will generally have both a region from which materials are sputtered in a PVD operation and a region from which materials are not sputtered in the PVD operation. The non-sputtering region can encompass, for example, a region proximate sidewall 14 corresponding to a laterally peripheral region of face 12.

As discuss above, a problem with utilizing target construction 10, or other target configurations, in sputtering operations is that some materials sputtered from face 12 can redeposit on other surfaces of the target construction (such as non-sputtered regions including the sidewalls 14, flange 16 and non-sputtered regions of face 12). The re-deposited material can ultimately fall from the target construction as particles during a PVD operation. The particles can deposit within a layer sputter-deposited during the PVD operation to detrimentally effect properties of the layer, and/or can fall onto an electrostatic chuck provided to support a substrate. It is therefore desired to develop methods for treating the sidewalls and/or flange and/or other non-sputtered surfaces of the target to avoid particle contamination of a sputter-deposited layer.

In accordance with an aspect of the present invention, surfaces of face 12 (the non-sputtered surfaces), sidewall 14 and/or flange 16 are treated by new methodologies to alleviate particle formation. The treated regions can, for example, extend partially or entirely across the regions indicated by brackets 18 in FIG. 3. It can be particularly preferred to utilize methodology of the present invention to treat all non-sputtered surfaces of a target (whether on the face 12, sidewall 14 or flange 16) that are exposed to a vacuum within a PVD reaction chamber.

Figure 4:
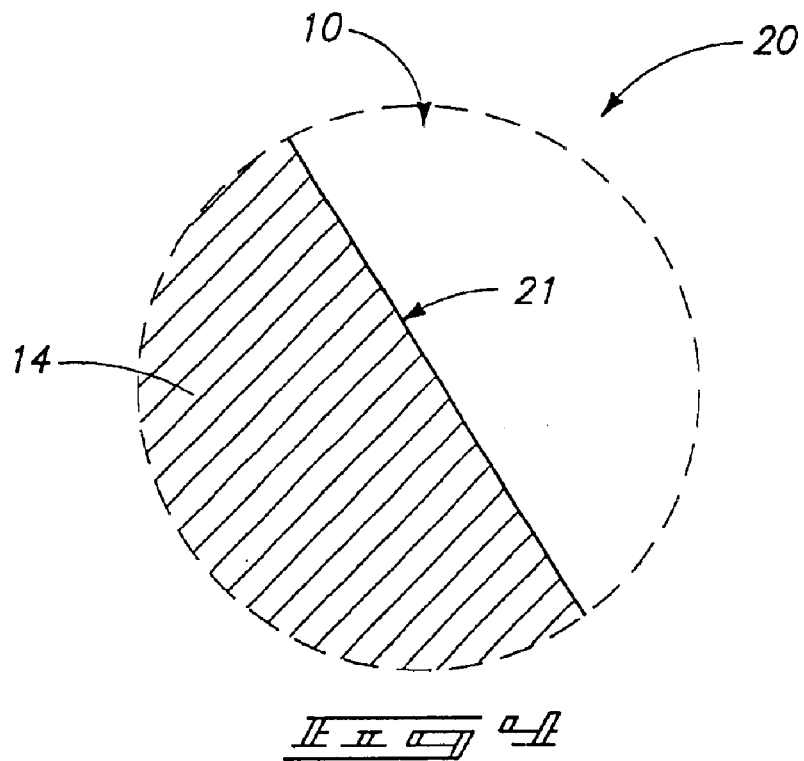
FIG. 4 is a view of an expanded region of the FIG. 3 target construction (the region labeled 4 in FIG. 3), and shown at a preliminary processing stage of an exemplary method of the present invention.

FIG. 4 shows an expanded region 20 of sidewall 14 at a preliminary processing stage of an exemplary method of the present invention. The sidewall has a relatively planar surface 21.

Figure 5:
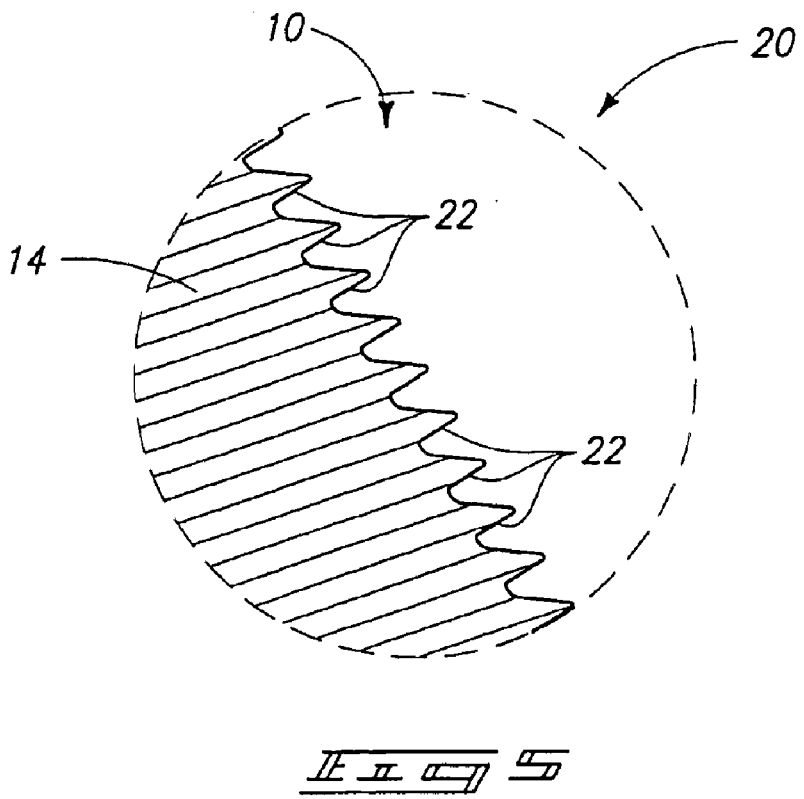
FIG. 5 is a view of the FIG. 4 expanded region shown at a processing stage subsequent to that of FIG. 4.

FIG. 5 illustrates expanded region 20 after sidewall 14 has been treated to form a pattern of projections 22 extending across a surface of the sidewall. Projections 22 can be formed utilizing a computer numerically controlled (CNC) tool, knurling device or other suitable machine tool, and can correspond to a scroll pattern. For example, a CNC tool can be utilized to cut into sidewall 14 and leave the shown pattern and/or a knurling device can be utilized to press into sidewall 14 and leave the pattern. The pattern is a repeating pattern, as opposed to a random pattern that would be formed by, for example, bead blasting. The pattern of projections 22 can be referred to as a macro-pattern, to distinguish the pattern from a micro-pattern that can be subsequently formed (discussed below). The projections 22 can be formed to a density of from about 28 per inch to about 80 per inch, with about 40 per inch being typical. In particular applications the projections can be formed with a tool having from about 28 teeth per inch (TPI) to about 80 TPI, with about 40 TPI being typical. The teeth of the tool can be in a one-to-one correspondence with the projections 22. The projections 22 can be formed across a surface of flange 16 (FIG. 3) and/or non-sputtered regions of face 12 alternatively, or additionally to formation of the projections along the sidewall surface 14.

FIG. 6 shows expanded region 20 after the projections 22 have been subjected to a mechanical force which bends the projections over. The mechanical force can be provided by any suitable tool, including, for example, a ball or roller. The bent projections can also be formed utilizing suitable directional machining with a CNC tool. The bent projections define cavities 23 between the projections, and such cavities can function as traps for redeposited material and/or other sources of particles.

Referring again to FIG. 3, sidewall 14 can be considered to be proximate sputtering face 12, and to form a lateral periphery of target construction 10 around the sputtering face. The bent projections 22 (which can also be referred to as curved projections) of FIG. 6 can thus be understood to form cavities 23 which open laterally along the sidewall. The cavities 23 can alternatively be considered a repeating pattern of receptacles formed by the bent, or curved, projections 22. The receptacles 23 can ultimately be utilized for retaining re-deposited materials, or other materials that could be one of the sources of particles during a PVD process. The receptacles 23 have inner surfaces 27 around an interior periphery of the receptacles.

If the sputtering surface 12 (FIG. 3) is defined as an upper surface of target construction 10 (i.e., if the target construction is considered in the orientation of FIG. 3), the shown cavities open downwardly. In other aspects of the invention (not shown) the curved projections can form cavities which open upwardly in the orientation of FIG. 3, or sidewardly. Accordingly, the invention encompasses aspects in which a sputtering face is defined as an upper surface of a target construction, and in which curved projections are formed along a sidewall of the target construction to form cavities which open laterally along the sidewall in one or more of a downward, upward and sideward orientation relative to the defined upper surface of the sputtering face. It is noted that the sputtering face is defined as an upper surface for purposes of explaining a relative orientation of the cavities formed by the curved projections, rather than as indicating any particular orientation of the target construction relative to an outside frame of reference. Accordingly, the sputtering surface 12 (FIG. 3) may appear as an upward surface of the target construction, downward surface of the target construction, or side surface of the target construction to a viewer external to the target construction; but for purposes of interpreting this disclosure and the claims that follow, the surface can be considered a defined upper surface to understand the relationship of the sputtering surface to the directionality of the openings of the cavities 23 formed by curved projections 22.

Figure 1:
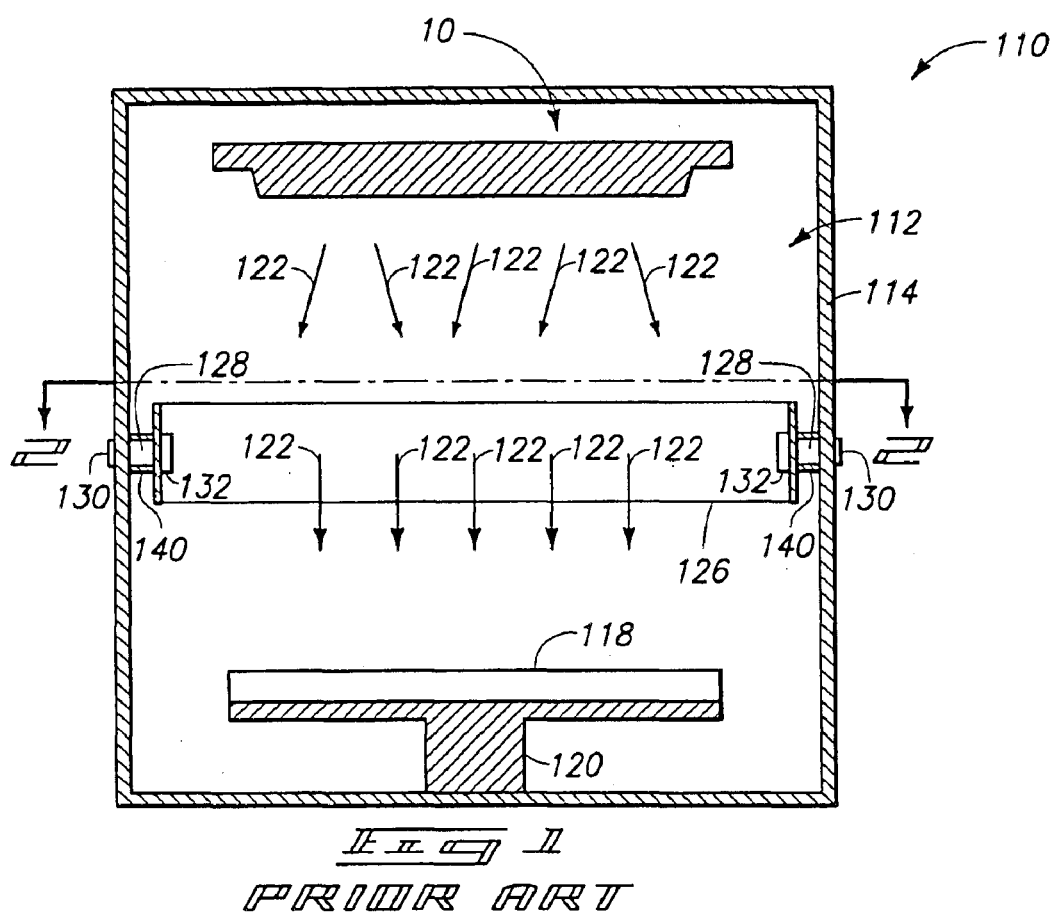
FIG. 1 is a diagrammatic, cross-sectional view of a prior art physical vapor deposition apparatus shown during a physical vapor deposition (e.g., sputtering) process.

It can be advantageous that the cavities 23 open upwardly in the orientation in which target construction 10 is ultimately to be utilized in a sputtering chamber (such as, for example, the chamber 12 of FIG. 1). Accordingly, it can be advantageous that the cavities open in the shown downward configuration relative to a sputtering surface 12 defined as an upper surface of the target construction.

FIG. 7 illustrates an expanded region 30 of the FIG. 6 structure, and specifically illustrates a single projection 22.

The curved projections 22 of FIGS. 6 and 7 can have a height "H" above surface 14 of, for example, from about 0.0001 inch to about 0.1 inch (typically about 0.01 inch), and a repeat distance ("R") of from about 0.001 inch to about 1 inch (typically about 0.027 inch). The distance "R" can be considered to be a periodic repeat distance of the curved projections 22.

In particular aspects, curved projections 22 can be considered to have bases 25 where the curved projections join to sidewall 14, and sidewall 14 can be considered to have a surface 15 extending between the bases of the curved projections. The curved projections will typically have a maximum height above the sidewall surface 15 of from about 0.0001 inches to about 0.01 inches.

FIGS. 8 and 9 show the projections 22 after they have been exposed to a pressurized stream of particles (e.g., bead-blasting) to form microstructures 32 extending along the projections as cavities or divots. The particles preferably penetrate into the receptacles 23 to roughen the inner surfaces 27 (as shown).

The particles used to form the microstructures can comprise, for example, one or more of silicon carbide, aluminum oxide, solid $H_2O$ (ice), or solid carbon dioxide. If the particles comprise a non-volatile material, a cleaning step can be introduced after formation of divots 32 to remove the particles. For instance, if the particles comprise silicon carbide or aluminum oxide, a cleaning step can be utilized wherein projections 22 are exposed to a bath or stream of cleaning material and/or are brushed with an appropriate brushing tool (such as a wire brush). A suitable stream can be a stream comprising solid $H_2O$ or solid carbon dioxide particles. If the particles initially utilized to form divots 32 consist essentially of, or consist of, volatile particles (such as solid ice or solid $CO_2$), then the cleaning step described above can be omitted. In a particular aspect, the bead-blasting media is 24 grit $Al_2O_3$ media, and the bead-blasting is conducted to, for example, from about 1 to about 4000 micro-inch RA, preferably from about 50 to about 2000 micro-inch RA, and typically from about 100 to about 300 micro-inch RA.

The bead-blasting of the present invention can be conducted at much lower pressures than the pressures typical of prior art processes, which can reduce a likelihood that bead-blasted particles will become embedded in structures treated with the present invention. Specifically, prior art bead-blasting is typically conducted at pressures of at least about 80 pounds per square inch (psi) (i.e., is conducted by pushing particulates at a structure with impact pressures imparted by the particulates on the structure averaging at least about 80 psi). In contrast, bead-blasting of the present invention can be conducted at pressures of less than or equal to 20 psi. To further reduce a likelihood of bead-blasted particles remaining imbedded or otherwise associated with a surface treated in accordance with the present invention, the surface can be cleaned after the bead-blasting by mechanically brushing the surface (utilizing, for example, a wire brush), and/or by spraying the surface with a volatile cleaning agent (e.g., by blasting the surface with $CO_2$), and/or by spraying the surface with a non-volatile cleaning agent.

The sidewall 14 shown at the processing stage of FIGS. 8 and 9 can be considered to have a surface comprising a trapping area with both macro-scale and micro-scale structures therein. Specifically, projections 22 can have a length of 0.01 inches, and can be considered to be a macro-scale feature formed on a substrate. The divots formed within the projections can be considered to be micro-scale structures formed along surfaces of projections 22. The combination of the micro-scale and macro-scale structures can alleviate, and even prevent, the problems described previously in this disclosure regarding undesired incorporation of particles into sputter-deposited layers.

Although the exemplary aspect of the invention described herein forms the microstructures on projections 22 after bending the projections, it is to be understood that the invention encompasses other aspects (not shown) in which the microstructures are formed prior to bending the projections. Specifically, projections 22 can be subjected to bead-blasting at the processing stage of FIG. 5, and subsequently bent, rather than being bent and subsequently subjected to bead-blasting.

The projections 22 of FIGS. 5–9 can be formed along some or all of the region 18 of FIG. 3. Accordingly, the projections can extend at least partially along sidewall 14 and/or at least partially along flange 16 and/or along non-sputtered laterally peripheral regions of face 12. In particular aspects, the projections will extend entirely along sidewall surface 14, and/or will extend entirely along flange 16 and/or will extend entirely along non-sputtered laterally peripheral regions of face 12.

FIGS. 2 and 3 illustrate a monolithic target construction. Persons of ordinary skill in the art will recognize that sputtering target constructions can also comprise target/backing plate constructions. Specifically, a sputtering target can be bonded to a backing plate prior to provision of the target in a sputtering chamber (such as the chamber described with reference to FIG. 1). The target/backing plate construction can have any desired shape, including the shape of the monolithic target of FIGS. 2 and 3. The backing plate can be formed of a material cheaper than the target, more easy to fabricate than the target, or having other desired properties not possessed by the target and is utilized to retain the target in the sputtering chamber. The invention can be utilized to treat target/backing plate constructions in a manner analogous to that described in FIGS. 2–9 for treating a monolithic target construction.

Figure 10:
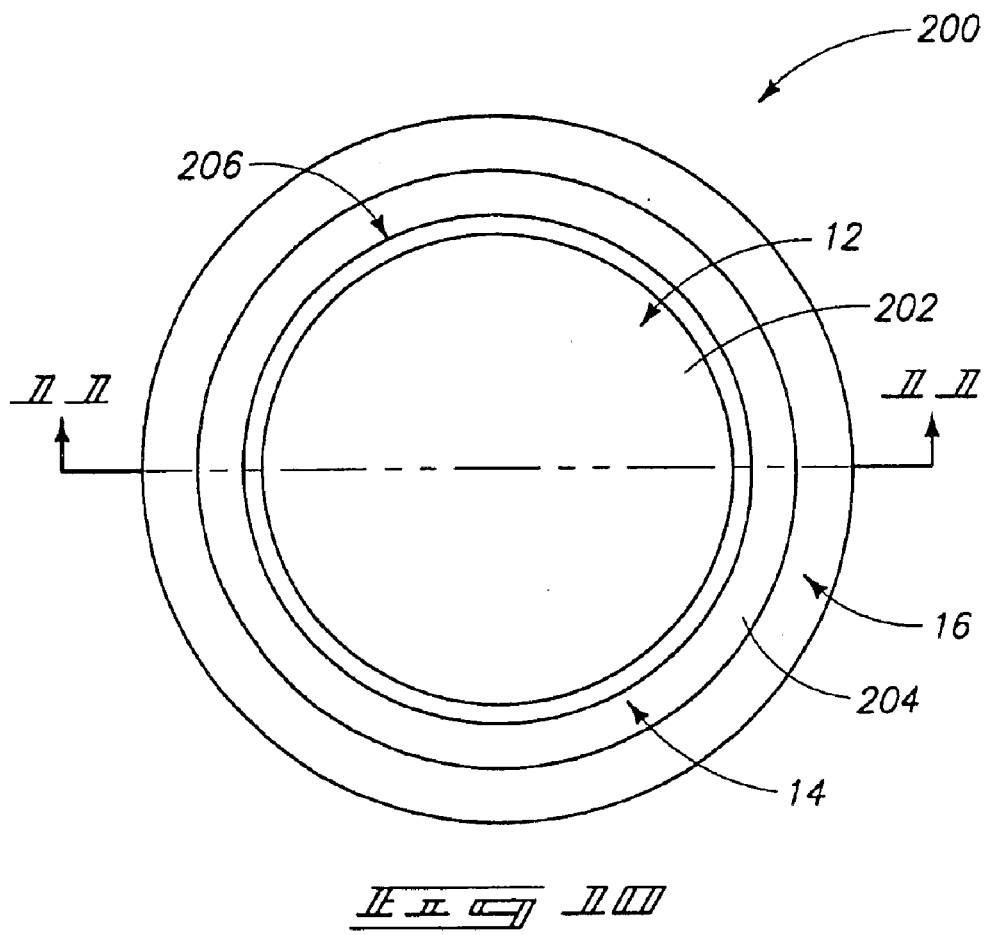
FIG. 10 is a diagrammatic, top view of an exemplary target/backing plate construction suitable for utilization in methodology of the present invention.
Figure 11:
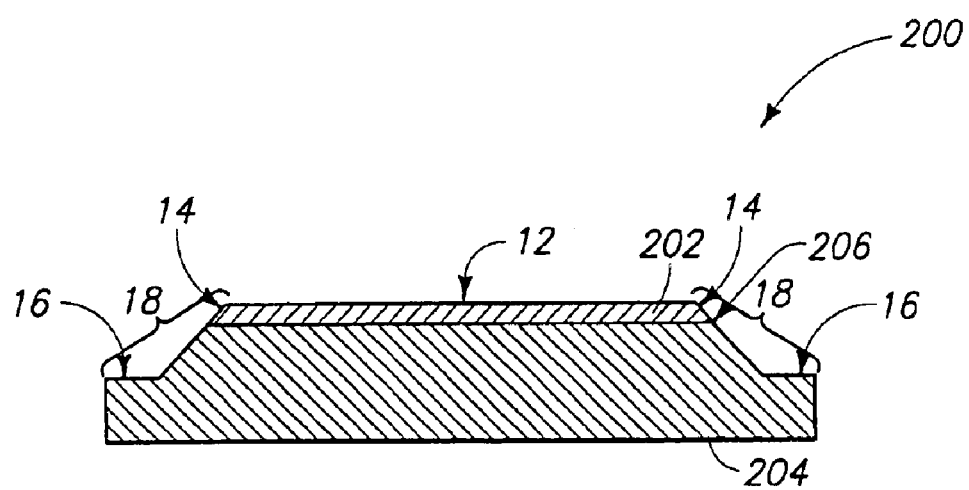
FIG. 11 is a diagrammatic, cross-sectional view along the line 11—11 of FIG. 10.

FIGS. 10 and 11 illustrate an exemplary target/backing plate construction (or assembly) 200 which can be treated in accordance with methodology of the present invention. In referring to FIGS. 10 and 11 similar number will be utilized as was used above in describing FIGS. 2–9, where appropriate.

Construction 200 comprises a target 202 bonded to a backing plate 204. The target and backing plate join at an interface 206 in the shown assembly. The bond between target 202 and backing plate 204 can be any suitable bond, including, for example, a solder bond or a diffusion bond. Target 202 can comprise any desired material, including metals, ceramics, etc. In particular aspects, the target can comprise one of more of the materials described previously relative to the target 10 of FIGS. 2 and 3. Backing plate 204 can comprise any appropriate material or combination of materials, and frequently will comprise one or more metals, such as, for example, one or more of Al, Cu and Ti.

Construction 200 has a similar shape to the target construction 10 of FIGS. 2 and 3. Accordingly, construction 200 has a sputtering face 12, a sidewall 14 and a flange 16. Any of various non-sputtered surfaces of construction 200 can be treated with methodology of the present invention similarly to the treatment described above with reference to FIGS. 2–9. Accordingly, all or part of a shown region 18 of construction 200 can be treated.

A difference between construction 200 of FIG. 11 and construction, 10 of FIG. 3 is that sidewall 14 of the FIG. 11 construction includes both a sidewall of a backing plate (204) and a sidewall of a target (202), whereas the sidewall 14 of the FIG. 3 construction included only a target sidewall. The treated region 18 of the FIG. 11 construction can thus include particle traps formed along a sidewall of backing plate 204 and/or particle traps formed along a sidewall of target 202. Additionally or alternatively, the treated region can comprise particle traps formed along flange 16 and/or can include particle traps formed along a non-sputtered portion of face 12. The particle traps can be formed with methodology identical to that described with reference to FIGS. 4–9.

The target 202 of construction 200 can be treated to form particle traps along sidewall regions and/or non-sputtered regions of the sputtering face before or after the target is bonded to the backing plate. Similarly, the backing plate 204 of the construction can be treated to form particle traps along sidewall regions and/or flange regions before or after the backing plate is bonded to the target. Typically, both the target and the backing plate will have one or more surfaces treated to form particle traps, and the treatment of the target and/or backing plate of construction 200 will occur after bonding the target to the backing plate so that the target and backing plate can be concurrently treated with the same processing tool.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A PVD target having a sidewall proximate a sputtering face, wherein the sidewall forms a lateral periphery of the target, the target comprising:
   a pattern of curved projections along the sidewall which form cavities that open laterally along the sidewall; and
   bead-blast-formed microstructures on the curved projections.

2. The target of claim 1 wherein the target is part of a target/backing plate construction.

3. The target/backing plate construction of claim 2 wherein the backing plate has a sidewall and wherein the pattern of curved projections extends along the sidewall of the backing plate.

4. The target/backing plate construction of claim 3 wherein the backing plate has a flange and wherein the pattern of curved projections extends along the flange of the backing plate.

5. The target of claim 1 wherein the curved projections have bases, wherein the sidewall has a surface extending between the bases of the curved projections, and wherein the curved projections have a maximum height above the sidewall surface of from about 0.0001 inches to about 0.01 inches.

6. The target of claim 1 wherein a periodic repeat of the curved projections across the sidewall occurs in a distance of from about 0.0001 inches to about 1 inch.

7. The target of claim 1 wherein the sputtering surface is defined as an upper surface; and wherein the cavities open upwardly.

8. The target of claim 1 wherein the sputtering surface is defined as an upper surface; and wherein the cavities open downwardly.

9. The target of claim 1 wherein the sputtering surface is defined as an upper surface; and wherein the cavities open sidewardly.

10. The target of claim 1 further comprising a flange spaced from the sputtering face by the sidewall, the flange having a surface, and wherein the pattern of curved projections extends along at least a portion of the surface of the flange.

11. A PVD target/backing plate construction having a sidewall proximate a sputtering face, comprising:

a repeating pattern of receptacles along the sidewall, the receptacles having inner surfaces along an interior periphery of the receptacles; and microstructures on the inner surfaces of the receptacles.

12. The target/backing plate construction of claim 11 wherein a portion of the sidewall is comprised by the target, and wherein the pattern of receptacles is along the portion of the sidewall comprised by the target.

13. The target/backing plate construction of claim 12 wherein a portion of the sidewall is comprised by the backing plate, and wherein the pattern of receptacles is along the portion of the sidewall comprised by the backing plate.

14. The target/backing plate construction of claim 11 wherein a portion of the sidewall is comprised by the backing plate, and wherein the pattern of receptacles is along the portion of the sidewall comprised by the backing plate.

15. The target/backing plate construction of claim 11 wherein the receptacles are defined by bent projections extending from the sidewall; wherein the bent projections have bases, wherein the sidewall has a surface extending between the bases of the bent projections, and wherein the bent projections have a maximum height above the sidewall surface of from about 0.0001 inches to about 0.01 inches.

16. The target/backing plate construction of claim 15 wherein a periodic repeat of the bent projections occurs In a distance of from about 0.0001 inches to about 1 inch.

17. The target/backing plate construction of claim 11 wherein the microstructures correspond to bead-blasted structures.

18. The target/backing plate construction of claim 11 further comprising a flange spaced from the sputtering face by the sidewall, the flange having a surface, and wherein the repeating pattern of receptacles extends along at least a portion of the surface of the flange.

19. The target/backing plate construction of claim 18 wherein the microstructures are on the receptacles that extend along at least a portion of the surface of the flange.

* * * * *

UNITED STATES PATENT AND TRADEMARK OFFICE
CERTIFICATE OF CORRECTION

PATENT NO. : 6,955,748 B2  Page 1 of 1
APPLICATION NO. : 10/614806
DATED : July 9, 2003
INVENTOR(S) : Jaeyeon Kim It is certified that error appears in the above-identified patent and that said Letters Patent is hereby corrected as shown below:

Col. 2, line 32 –
 Replace "the particles from for the blasting can be imbedded in the"
 With --the particles from the blasting can be imbedded in the --

Col. 4, line 42 –
 Replace "As discuss above, a problem with utilizing target"
 With --As discussed above, a problem with utilizing target--

Col. 4, line 52 –
 Replace "detrimentally effect properties of the layer, and/or can fall"
 With --detrimentally affect properties of the layer, and/or can fall--

Col. 7, line 63 –
 Replace "referring to FIGS. 10 and 11 similar number will be utilized"
 With --referring to FIGS. 10 and 11 similar numbering will be utilized--

Col. 10, line 22 –
 Replace "wherein a periodic repeat of the bent projections occurs In"
 With --wherein a periodic repeat of the bent projections occurs in--

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,955,748 B2 Page 1 of 1
APPLICATION NO. : 10/614806
DATED : October 18, 2005
INVENTOR(S) : Jaeyeon Kim It is certified that error appears in the above-identified patent and that said Letters Patent is hereby corrected as shown below:

Col. 2, line 32 –
  Replace "the particles from for the blasting can be imbedded in the"
  With --the particles from the blasting can be imbedded in the --

Col. 4, line 42 –
  Replace "As discuss above, a problem with utilizing target"
  With --As discussed above, a problem with utilizing target--

Col. 4, line 52 –
  Replace "detrimentally effect properties of the layer, and/or can fall"
  With --detrimentally affect properties of the layer, and/or can fall--

Col. 7, line 63 –
  Replace "referring to FIGS. 10 and 11 similar number will be utilized"
  With --referring to FIGS. 10 and 11 similar numbering will be utilized--

Col. 10, line 22 –
  Replace "wherein a periodic repeat of the bent projections occurs In"
  With --wherein a periodic repeat of the bent projections occurs in--

This certificate supersedes Certificate of Correction issued August 29, 2006.

Signed and Sealed this

Seventh Day of November, 2006

JON W. DUDAS
*Director of the United States Patent and Trademark Office*